(12) United States Patent
Dai et al.

(10) Patent No.: US 12,063,780 B2
(45) Date of Patent: Aug. 13, 2024

(54) MEMORY CELL STRUCTURE OF A THREE-DIMENSIONAL MEMORY DEVICE

(71) Applicant: Yangtze Memory Technologies Co., Ltd., Hubei (CN)

(72) Inventors: Xiaowang Dai, Wuhan (CN); Zhenyu Lu, Hubei (CN); Jun Chen, Wuhan (CN); Qian Tao, Hubei (CN); Yushi Hu, Hubei (CN); Jifeng Zhu, Hubei (CN); Jin Wen Dong, Hubei (CN); Ji Xia, Hubei (CN); Zhong Zhang, Hubei (CN); Yan Ni Li, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 384 days.

(21) Appl. No.: 17/465,231

(22) Filed: Sep. 2, 2021

(65) Prior Publication Data
US 2021/0399001 A1 Dec. 23, 2021

Related U.S. Application Data

(60) Division of application No. 17/028,154, filed on Sep. 22, 2020, now Pat. No. 11,133,325, which is a
(Continued)

(30) Foreign Application Priority Data

Aug. 28, 2017 (CN) .......................... 201710749865.1

(51) Int. Cl.
*H10B 43/10* (2023.01)
*H01L 21/768* (2006.01)
(Continued)

(52) U.S. Cl.
CPC ....... *H10B 43/10* (2023.02); *H01L 21/76816* (2013.01); *H01L 21/76877* (2013.01);
(Continued)

(58) Field of Classification Search
CPC ........ H10B 41/20; H10B 43/10; H10B 41/35; H10B 41/41; H10B 43/27; H10B 43/35; H10B 43/20
See application file for complete search history.

(56) References Cited

U.S. PATENT DOCUMENTS 8,107,270 B2   1/2012  Scheuerlein et al.
8,878,278 B2  11/2014  Alsmeier et al.
(Continued)

FOREIGN PATENT DOCUMENTS

CN   101971336 A   2/2011
CN   104022120 A   9/2014
(Continued)

OTHER PUBLICATIONS

International Search Report and Written Opinion of the International Searching Authority directed to related International Patent Application No. PCT/CN2018/099378, mailed Nov. 13, 2018; 8 pages.

*Primary Examiner* — Moazzam Hossain
(74) *Attorney, Agent, or Firm* — Sterne, Kessler, Goldstein & Fox P.L.L.C.

(57) ABSTRACT

Various embodiments disclose a 3D memory device, including a substrate; a plurality of conductor layers disposed on the substrate; a plurality of NAND strings disposed on the substrate; and a plurality of slit structures disposed on the substrate. The plurality of NAND strings can be arranged perpendicular to the substrate and in a hexagonal lattice orientation including a plurality of hexagons, and each hexagon including three pairs of sides with a first pair
(Continued)

perpendicular to a first direction and parallel to a second direction. The second direction is perpendicular to the first direction. The plurality of slit structures can extend in the first direction.

20 Claims, 8 Drawing Sheets

Related U.S. Application Data division of application No. 16/847,427, filed on Apr. 13, 2020, now Pat. No. 10,847,528, which is a division of application No. 16/126,820, filed on Sep. 10, 2018, now Pat. No. 10,644,015, which is a continuation of application No. PCT/CN2018/099378, filed on Aug. 8, 2018.

(51) Int. Cl.

| | | |
|---|---|---|
| *H01L 23/522* | (2006.01) | |
| *H01L 23/528* | (2006.01) | |
| *H01L 23/532* | (2006.01) | |
| *H10B 41/10* | (2023.01) | |
| *H10B 41/27* | (2023.01) | |
| *H10B 41/35* | (2023.01) | |
| *H10B 41/41* | (2023.01) | |
| *H10B 43/27* | (2023.01) | |
| *H10B 43/35* | (2023.01) | |
| *H10B 43/40* | (2023.01) | |

(52) U.S. Cl.
CPC ...... *H01L 23/5226* (2013.01); *H01L 23/5283* (2013.01); *H01L 23/53257* (2013.01); *H10B 41/10* (2023.02); *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(56) References Cited

U.S. PATENT DOCUMENTS

| | | | |
|---|---|---|---|
| 8,916,926 B2 | 12/2014 | Choe et al. | |
| 9,230,984 B1 | 1/2016 | Takeguchi | |
| 9,263,462 B2 | 2/2016 | Eom | |
| 9,349,747 B2 | 5/2016 | Kim et al. | |
| 9,520,407 B2 | 12/2016 | Fukuzumi et al. | |
| 9,553,099 B2 | 1/2017 | Wolstenholme | |
| 9,553,101 B2 | 1/2017 | Kim et al. | |
| 10,644,015 B2 | 5/2020 | Dai et al. | |
| 10,644,020 B2 | 5/2020 | Huo et al. | |
| 10,847,528 B2 | 11/2020 | Dai et al. | |
| 2013/0009229 A1* | 1/2013 | Lee | H10B 43/35 257/E27.06 |
| 2013/0248974 A1 | 9/2013 | Alsmeier et al. | |
| 2016/0005761 A1 | 1/2016 | Vu et al. | |
| 2016/0276360 A1* | 9/2016 | Doda | H01L 29/66666 |
| 2017/0047334 A1 | 2/2017 | Lu et al. | |
| 2017/0125433 A1 | 5/2017 | Ogawa et al. | |
| 2017/0179154 A1 | 6/2017 | Furihata et al. | |
| 2017/0205925 A1 | 7/2017 | Yamazaki et al. | |
| 2017/0221813 A1 | 8/2017 | Kim | |
| 2017/0236836 A1 | 8/2017 | Huo et al. | |
| 2020/0243553 A1 | 7/2020 | Dai et al. | |
| 2021/0005625 A1 | 1/2021 | Dai et al. | |

FOREIGN PATENT DOCUMENTS

| | | |
|---|---|---|
| CN | 104157654 A | 11/2014 |
| CN | 104205342 A | 12/2014 |
| CN | 104253130 A | 12/2014 |
| CN | 104347634 A | 2/2015 |
| CN | 104795103 A | 7/2015 |
| CN | 105261617 A | 1/2016 |
| CN | 105336724 A | 2/2016 |
| CN | 106033791 A | 10/2016 |
| CN | 106601743 A | 4/2017 |
| CN | 107068687 A | 8/2017 |
| CN | 107658311 A | 2/2018 |
| KR | 2012-0060661 A | 6/2012 |
| KR | 2016-0028087 A | 3/2016 |
| TW | 201703203 A | 1/2017 |
| TW | 201714283 A | 4/2017 |
| TW | I582953 B | 5/2017 |

* cited by examiner

MEMORY CELL STRUCTURE OF A THREE-DIMENSIONAL MEMORY DEVICE

CROSS-REFERENCES TO RELATED APPLICATIONS

This application is a divisional of U.S. patent application Ser. No. 17/028,154, filed on Sep. 22, 2020 and titled "Memory Cell Structure Of a Three-Dimensional Memory Device," which is a divisional of U.S. patent application Ser. No. 16/847,427, filed on Apr. 13, 2020 and now U.S. Pat. No. 10,847,528 issued on Nov. 24, 2020, which is a divisional of U.S. patent application Ser. No. 16/126,820, filed on Sep. 10, 2018, now U.S. Pat. No. 10,644,015 issued on May 5, 2020, which claims priority to International Application No. PCT/CN2018/099378, filed on Aug. 8, 2018, which claims priority to Chinese Patent Application No. 201710749865.1 filed on Aug. 28, 2017, all of which are incorporated herein by reference in their entirety.

TECHNICAL FIELD

The present disclosure generally relates to the field of semiconductor technology, and more particularly, to a method for forming a three-dimensional (3D) memory device.

BACKGROUND

Flash memory devices have undergone rapid development. Flash memory devices can store data for a considerably long time without powering, and have advantages such as high integration level, fast access, easy erasing, and rewriting.

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit.

As advances in integration level and increases in demand for storage, to further improve the bit density and reduce cost of flash memory devices, 3D NAND flash memory devices have been developed. A 3D memory architecture can address the density limitation in planar memory cells.

As semiconductor technology advances, 3D memory devices, such as 3D NAND memory devices, keep scaling more oxide/nitride (ON) layers to improve the area utilization of wafers. In some existing 3D NAND memory devices, a memory finger includes multiple rows of channel holes arranged in a staggered manner. It is a challenge to increase memory density while providing uniform channel holes deposition and reducing etch loading effect.

BRIEF SUMMARY

Embodiments of a 3D memory device architectures and fabrication methods therefore are disclosed herein. The disclosed structures and methods provide numerous benefits, including, but not limited to increasing memory density, simplifying the fabrication process, improving etching uniformity, and improving the space utility of the chip which the 3D memory device is formed on.

Disclosed is a 3D memory device, including: a substrate; a plurality of conductor layers disposed on the substrate; a plurality of NAND strings disposed on the substrate; and a plurality of slit structures disposed on the substrate. In some embodiments, the plurality of NAND strings is arranged perpendicular to the substrate and in a hexagonal lattice orientation including a plurality of hexagons, and each hexagon including three pairs of sides with a first pair perpendicular to a first direction and parallel to a second direction. The second direction is perpendicular to the first direction. In some embodiments, the plurality of slit structures extend in the first direction.

In some embodiments, the plurality of slit structures include a plurality of gate line slits. In some embodiments, the gate line slits are parallel to a second and a third pair of sides of each hexagon of the hexagonal lattice, forming a zigzag pattern extending in the first direction.

In some embodiments, the plurality of NAND strings intersect with each conductor layer of the plurality of conductor layers forming a plurality of intersections, and the plurality of intersections form a hexagonal lattice. In some embodiments, the slit structure is parallel to the second and the third pair of sides of each hexagon of the hexagonal lattice, forming a zigzag pattern extending in the first direction.

In some embodiments, the slit structures further include a plurality of through holes.

In some embodiments, the conductor layer includes tungsten.

In some embodiments, the 3D memory device further includes a top select gate.

In some embodiments, the top select gate is parallel to the slit structures and forms a zigzag pattern extending in the first direction.

In some embodiments, the 3D memory device further includes a 3D memory drive circuit on the substrate configured to supplying a voltage source to the 3D memory device.

In some embodiments, the 3D memory device further includes a plurality of bit lines. In some embodiments, the plurality of bit lines form a 30-degree angle with respect to the second direction.

In some embodiments, the 3D memory device further includes a plurality of bit line contacts. In some embodiments, a spacing between two neighboring bit lines is D nm, a spacing between two neighboring bit line contacts is about 1.15*D nm, and D is between about 10 nm and about 60 nm.

Another aspect of the present disclosure provides a 3D memory device, including: an alternating conductor/dielectric stack disposed on a substrate; a plurality of channel holes formed on the substrate penetrating the alternating conductor/dielectric stack; a channel structure in each channel hole; and a plurality of gate line slit disposed on the substrate. In some embodiments, the plurality of channel holes are perpendicular to the substrate and are arranged in a hexagonal lattice orientation including a plurality of hexagons, and each hexagon including three pairs of sides, with a first pair perpendicular to a first direction and parallel to a second direction. The second direction is perpendicular to the first direction. In some embodiments, the plurality of gate line slit extend in the first direction.

In some embodiments, the alternating conductor/dielectric stack includes a plurality of conductor/dielectric layers stacked in a vertical direction, and each conductive/dielectric layer includes a dielectric layer and a conductor layer.

In some embodiments, the channel structure includes a semiconductor channel and a memory film.

In some embodiments, the 3D memory device further includes a top select gate structure. In some embodiments, the top select gate is parallel to the gate line slit, forming a zigzag pattern extending in the first direction.

Another aspect of the present disclosure provides a method for forming a 3D memory device, including: 1) forming an alternating dielectric stack on a substrate; 2) forming a staircase structure in the alternating dielectric stack; 3) forming a plurality of channel structures in the alternating dielectric stack, with each channel structures extending vertically through the alternating dielectric stack, and the plurality of channel structures being arranged in a hexagonal lattice and each hexagon including three pairs of sides, with a first pair perpendicular to a first direction and parallel to a second direction, and the first direction perpendicular to the second direction; 4) forming a slit, and replacing a portion of the alternating dielectric stack with conductor layers to form an alternating conductor/dielectric stack including a plurality of conductor/dielectric layers; 5) disposing a conductor in the slit to form a slit structure, which is parallel to a second and a third pair of sides of each hexagon of the hexagonal lattice, forming a zigzag pattern extending in the first direction; and 6) forming a plurality of contacts on the substrate.

In some embodiments, forming the channel structure includes forming a semiconductor channel and forming a memory film.

In some embodiments, forming the slit structure includes forming a gate line slit by PVD, CVD, ALD, or a combination thereof.

In some embodiments, the method further includes forming a plurality of through holes on the gate line slit.

In some embodiments, the method further includes forming a top select gate structure. In some embodiments, the top select gate is parallel to the slit structure, forming a zigzag pattern extending in the first direction.

In some embodiments, forming the plurality of contact includes forming a plurality of bit line contact by photolithography, etching, thin film deposition, chemical mechanical polishing, or a combination thereof.

In some embodiments, forming the plurality of contact includes forming a plurality of through array contact by photolithography, etching, thin film deposition, chemical mechanical polishing, or a combination thereof.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide a method for forming a 3D memory device with a specific memory array (also referred to herein as an "NAND string") arrangement. By arranging NAND string in a hexagonal lattice (e.g., honeycomb pattern) with each hexagon of the hexagonal lattice having a first pair of sides perpendicular to slit structures (e.g., gate line slit) and parallel to etching/deposition gas ventilation pathway, the formed NAND string array can increase memory density, provide smooth gas pathway to improve etching uniformity, increase spacing for bit line connection, and simplify the fabrication process.

Figure 1:
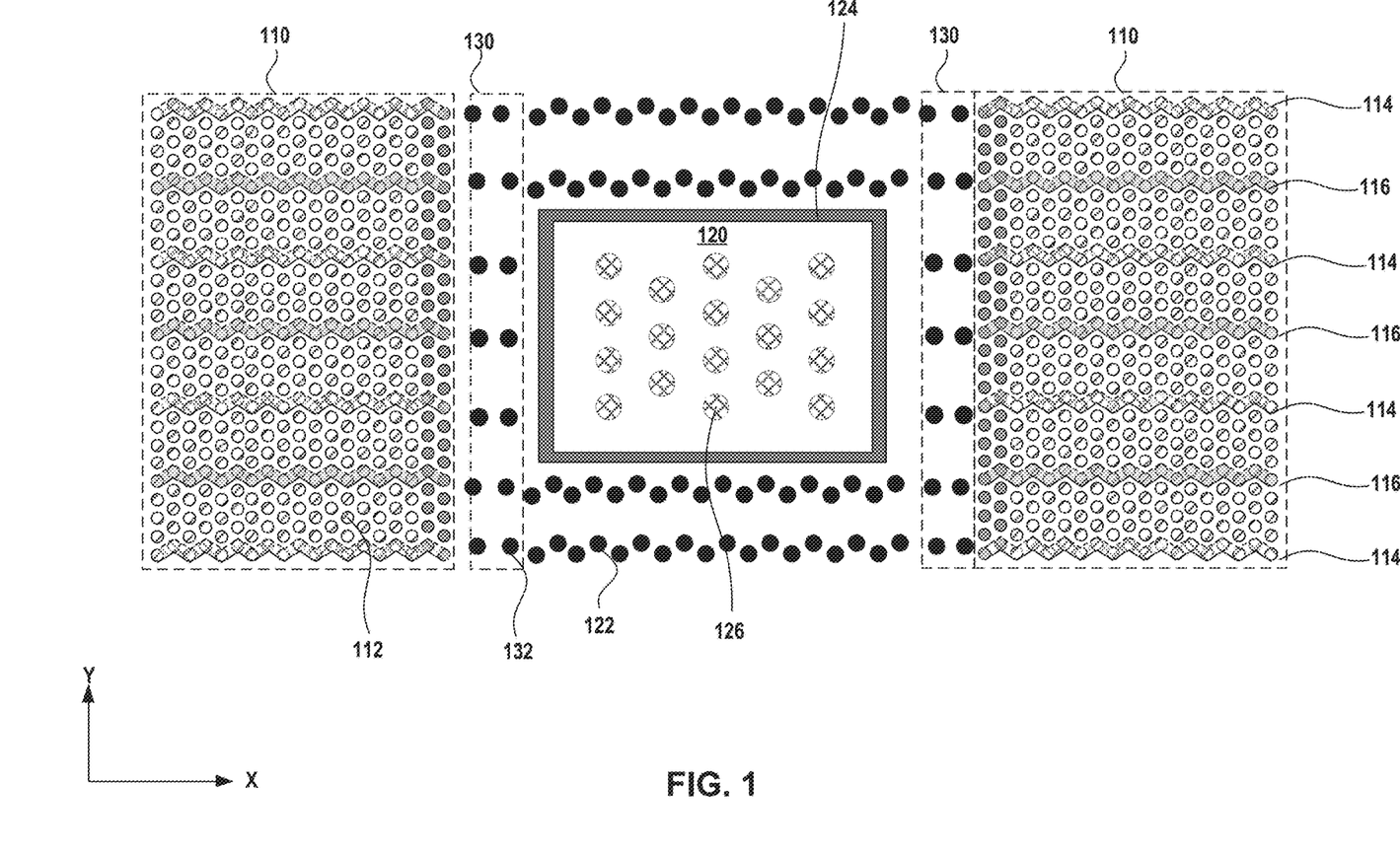
FIG. 1 illustrates a plan view of various regions of a 3D memory device, according to some embodiments of the present disclosure.

FIG. 1 illustrates a plan view of various regions of a 3D memory device, according to some embodiments of the present disclosure. FIG. 1 depicts a 3D memory device 100, including NAND string regions 110, a TAC (through array contact) region 120, and top select gate (TSG) staircase regions 130. NAND string regions 110 can include an array of NAND strings 112, each including a plurality of stacked memory cells. TAC region 120 can be disposed between two NAND string regions 110 and including a plurality of TACs 126. TSG staircase regions 130 can be disposed on the sides of NAND string regions 110 and adjacent to TAC region 120 in the plan view. TSG staircase regions 130 can include an array of TSG contacts 132 formed on a staircase structure (e.g., with two levels) for making electrical connections with the top select gates 116 of NAND strings 112 in NAND string region 110. In some embodiments, dummy channel structures 122 are formed outside TAC region 120 to provide mechanical support for the memory array structures. It is understood that dummy channel structures 122 can be formed in any regions outside TAC region 120, for example, along the edges of NAND string regions 110 adjacent to TSG staircase regions 130. As shown in FIG. 1, 3D memory device 100 can also include a plurality of slit structures 114 each extending in the word line direction (x axis, also referred to herein as "first direction"). At least some slit structures 114 can function as the common source contact for an array of NAND strings 112 in NAND string regions 110. Slit structures 114 (e.g., gate line slit) can also divide the 3D memory device into multiple memory blocks and/or multiple memory fingers. A top select gate 116 can be formed in the middle of the memory finger to separate the memory finger into two equal parts. In some embodiments, 3D memory device 100 can also include a peripheral device on the substrate (not shown). The peripheral device can include any suitable digital, analog, and/or mixed-signal peripheral circuits used for facilitating the operation of a 3D memory device 100. For example, the peripheral device can include one or more of a page buffer, a decoder (e.g., a row decoder and a column decoder), a driver, a charge pump, a current or voltage reference, or any active or passive components of the circuits (e.g., transistors, diodes, resistors, or capacitors). In some embodiments, the peripheral device can include a drive circuit configured to supplying a voltage source to the 3D memory device. In some embodiments, the peripheral device is formed using CMOS technology, and peripheral device structure can be referred to as a "CMOS structure" or a "CMOS chip."

Figure 2:
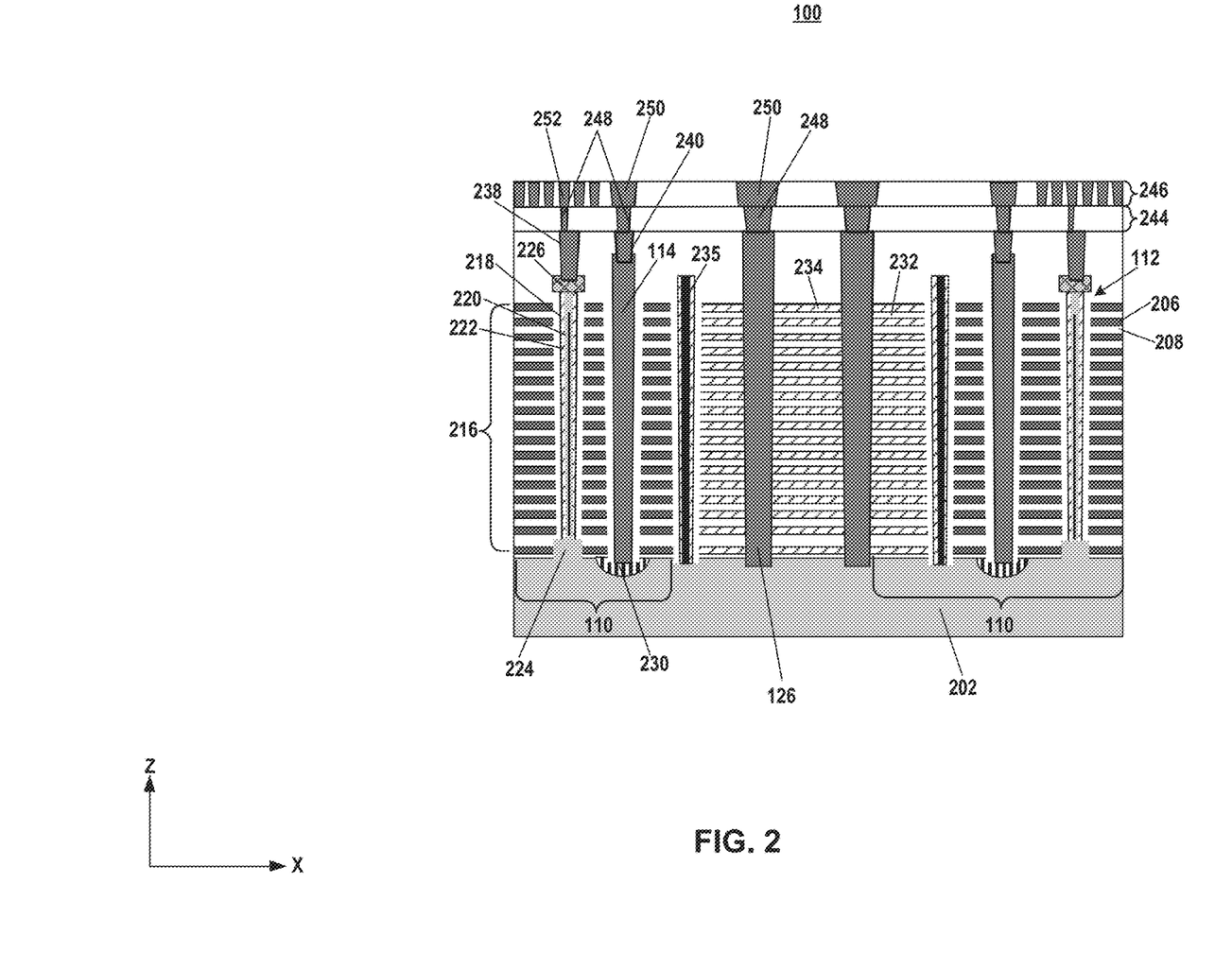
FIG. 2 illustrates a cross-sectional view of a 3D memory device, according to some embodiments of the present disclosure.

FIG. 2 illustrates a cross-sectional view of a 3D memory device 100 (as shown in FIG. 1), according to some embodiments of the present disclosure. 3D memory device 100 can include a substrate 202. In some embodiments, substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which can be thinned by grinding, wet/dry etching, chemical mechanical polishing (CMP), or a combination thereof.

In some embodiments, 3D memory device 100 is a NAND Flash memory device in which memory cells are in the form of an array of NAND strings 112 extending vertically above substrate 202. 3D memory device 100 can include a plurality of NAND strings 112 that extend through a plurality of conductor layers 206 and dielectric layers 208. In some embodiments, a plurality of NAND strings 112 intersect with each conductor layer 206 forming a plurality of intersections, and the plurality of intersections form a hexagonal lattice in the horizontal plane (x-y plane). The plurality of conductor layers and dielectric layers are also referred to herein as an "alternating conductor/dielectric stack" 216. The number of the conductor/dielectric layers in alternating conductor/dielectric stack 216 (e.g., 32, 64, or 96) can set the number of memory cells in 3D memory device 100. Conductor layers 206 and dielectric layers 208 in alternating conductor/dielectric stack 216 alternate in the vertical direction. Conductor layers 206 can each have the same thickness or have different thicknesses. Similarly, dielectric layers 208 can each have the same thickness or have different thicknesses. Conductor layers 206 can include conductor materials including, but not limited to, tungsten (W), cobalt (Co), copper (Cu), aluminum (Al), polycrystalline silicon (polysilicon), doped silicon, silicides, or a combination thereof. Dielectric layers 208 can include dielectric materials including, but not limited to, silicon oxide, silicon nitride, silicon oxynitride, or a combination thereof. In some embodiments, conductor layers 206 include metal layers, such as W, and dielectric layers 208 include silicon oxide.

As shown in FIG. 2, each NAND string 112 can include a channel structure 218 extending through alternating conductor/dielectric stack 216. Channel structure 218 can include a channel hole filled with semiconductor materials (e.g., as a semiconductor channel 220) and dielectric materials (e.g., as a memory film 222). In some embodiments, semiconductor channel 220 includes silicon, such as amorphous silicon, polysilicon, or single crystalline silicon. In some embodiments, memory film 222 is a composite layer including a tunneling layer, a storage layer (also known as "charge trap/storage layer"), and a blocking layer. Each NAND string 112 can have a cylinder shape (e.g., a pillar shape). Semiconductor channel 220, the tunneling layer, the storage layer, and the blocking layer are arranged along a direction from the center toward the outer surface of the pillar in this order, according to some embodiments of the present disclosure. The tunneling layer can include silicon oxide, silicon nitride, or a combination thereof. The storage layer can include silicon nitride, silicon oxynitride, silicon, or a combination thereof. The blocking layer can include silicon oxide, silicon nitride, high dielectric constant (high-k) dielectrics, or a combination thereof.

In some embodiments, NAND string 112 includes an epitaxial plug 224 and an etch stop plug 226 at a respective end in the vertical direction. Each of epitaxial plug 224 and etch stop plug 226 can be in contact with a respective end of channel structure 218. Epitaxial plug 224 can include a semiconductor material, such as silicon, that is epitaxially grown from substrate 202. Epitaxial plug 224 can function as the channel controlled by a source selective gate of NAND string 112. Etch stop plug 226 can be at the upper end of NAND string 112 and in contact with channel structure 218 (e.g., on the upper end of channel structure 218). As used herein, the "upper end" of a component (e.g., NAND string 112) is the end further away from substrate 202 in the z-direction, and the "lower end" of the component (e.g., NAND string 112) is the end closer to substrate 202 in the z-direction when substrate 202 is positioned in the lowest plane of a 3D memory device 100. Etch stop plug 226 can include semiconductor materials (e.g., polysilicon) or conductor materials (e.g., metals). In some embodiments, etch stop plug 226 includes an opening filled with Ti/TiN (as a barrier layer) and W (as a conductor). By covering the upper end of channel structure 218 during the fabrication of a 3D memory device 100, etch stop plug 226 can function as an etch stop layer to prevent etching of dielectrics filled in channel structure 218, such as silicon oxide and silicon nitride. In some embodiments, etch stop plug 226 functions as the drain of NAND string 112.

In some embodiments, 3D memory device 100 further includes slit structures 114. Each slit structure 114 can extend vertically through alternating conductor/dielectric stack 216. Slit structure 114 can also extend laterally to separate alternating conductor/dielectric stack 216 into multiple blocks. Slit structure 114 can include a slit filled with conductor materials including, but not limited to, W, Co, Cu, Al, silicides, or a combination thereof. Slit structure 114 can further include a dielectric layer with any suitable dielectric materials between the filled conductor materials and alternating conductor/dielectric stack 216 to electrically insulate the filled conductor materials from surrounding conductor layers 206 in alternating conductor/dielectric stack 216. As a result, slit structures 114 can separate 3D memory device 100 into multiple memory blocks and/or memory fingers (e.g., as shown in FIG. 1 in the plan view). In some embodiments, slit structure 114 functions as the source contact for NAND strings 112 in the same memory block or the same memory finger that share the same array common source. Slit structure 114 can thus be referred to as a "common source contact" of multiple NAND strings 112. In some embodiments, substrate 202 includes a doped region 230 (including p-type or n-type dopants at a desired doping level), and the lower end of slit structure 114 is in contact with doped region 230 of substrate 202. Slit structure 114 thus can electrically connect to NAND strings 112 by doped region 230.

As shown in FIGS. 1 and 2, 3D memory device 100 can include TACs 126 each extending vertically through alternating dielectric stack 234. Each TAC 126 can extend through the entire thickness of alternating dielectric stack 234 (e.g., all the dielectric layers in the vertical direction). In some embodiments, TAC 126 further extends through at least part of substrate 202. TACs 126 can carry electrical signals from and/or to 3D memory device 100, such as part of the power bus, with shorten interconnect routing. In some embodiments, TACs 126 can provide electrical connections between 3D memory device 100 and the peripheral device (e.g., on a CMOS chip; not shown) and/or between BEOL interconnects (not shown) and the peripheral device. TACs 126 can also provide mechanical support to alternating layer stack 216. Each TAC 126 can include a vertical opening through alternating dielectric stack 234. The vertical opening can be filled with conductor materials, including, but not limited to, W, Co, Cu, Al, doped silicon, silicides, or a combination thereof.

In some embodiments, 3D memory device 100 includes a plurality of local contacts in contact with the various memory array structures disclosed herein, such as NAND strings 112, slit structures 114, and conductor layers 206 (word lines) in a staircase region (e.g., staircase regions 130 in FIG. 1). The contacts are referred to herein as "local contacts" as they are in contact with the memory array structures directly. As shown in FIG. 2, local contacts can include NAND string contacts 238 and slit structure contacts 240. As used herein, the term "contact" can broadly include any suitable types of interconnects, including vertical interconnect accesses (e.g., vias) and lateral lines (e.g., interconnect lines). In some embodiments, an end (e.g., the upper end) of each local contact is flush with one another, e.g., on the top surface of a dielectric layer in which the local contacts are formed. Another end (e.g., the lower end) of each local contact can be in contact with the respective memory array structure. For example, the lower end of NAND string contact 238 can be in contact with etch stop plug 226 of NAND string 112, and the lower end of slit structure contact 240 can be in contact with the upper end of slit structure 114. Each local contact can include an opening (e.g., a via hole or a trench) filled with conductor materials including, but not limited to, W, Co, Cu, Al, silicides, or a combination thereof.

As shown in FIG. 2, in addition to the local contacts, 3D memory device 100 can further include a contact layer 244 and an interconnect conductor layer 246 as part of the interconnect structures. Contact layer 244 can include a dielectric layer and a plurality of contacts 248 (e.g., vias) in the dielectric layer. Interconnect conductor layer 246 can be formed on contact layer 244 and can include a dielectric layer and a plurality of contacts 250 (e.g., interconnect lines) in the dielectric layer. Each contact 250 can include an opening (e.g., a trench) filled with conductor materials including, but not limited to, W, Co, Cu, Al, silicides, or a combination thereof. All contacts 250 can be formed simultaneously in a single contact formation process. In some embodiments, contacts 250 in interconnect conductor layer 246 include bit lines 252 electrically connected to NAND strings 112, respectively, by corresponding contact 248 and NAND string contact 238 to individually address corresponding NAND string 112. Contacts 250 can further include source lines electrically connected to slit structures 114 (source contacts), interconnect lines electrically connected to TACs 126, and interconnect lines electrically connected to word lines in the staircase region (e.g., staircase regions 130 in FIG. 1).

Figure 3A:
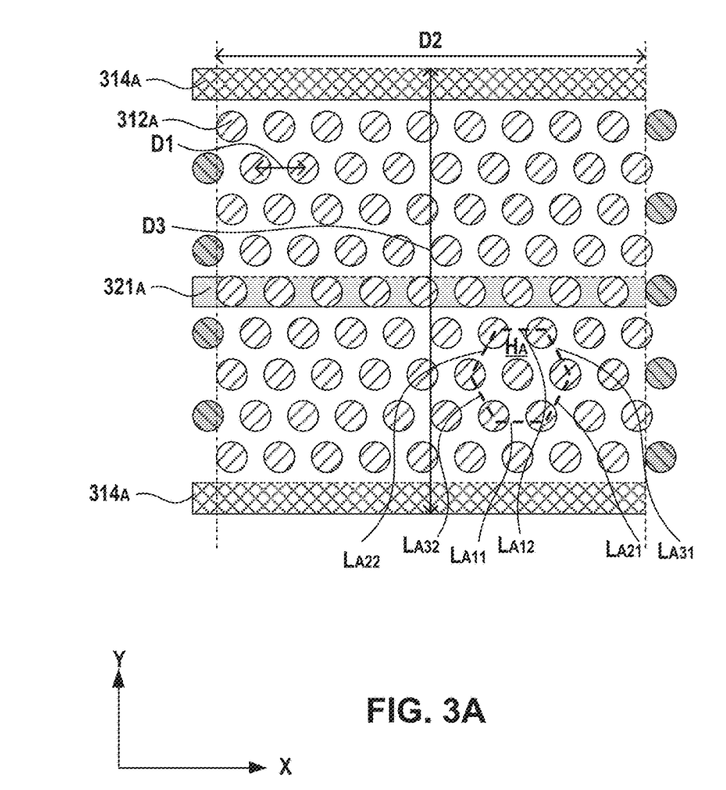
FIG. 3A illustrates a schematic enlarged plan view of a NAND string region of a 3D memory device with a memory array arrangement.

FIGS. 3A, 4A, 5A, 6A, and 7A show various regions of a 3D memory device with one memory array arrangement. FIGS. 3B, 4B, 5B, 6B, and 7B show various regions of a 3D memory device with another memory array arrangement, according to some embodiments of the present disclosure (e.g., memory array arrangement in FIG. 1). FIG. 3A illustrates a schematic enlarged plan view of a NAND string region of a 3D memory device with a memory array (NAND string) arrangement. A plurality of NAND strings $312_A$ are arranged in a hexagonal lattice. Each NAND string can be disposed at vertices and center of hexagons of a hexagonal lattice. As used herein, a hexagonal lattice is a two-dimensional lattice structure in which hexagons of a same shape are repeated along three different directions. Each hexagon (e.g., hexagon $H_A$) within the hexagonal lattice has a same hexagonal shape, which can be a regular hexagonal shape in which all sides of the hexagon have the same length. The angle between adjoining sides of each hexagon can be 60 degrees. Each hexagon has three pairs of sides, e.g., a first pair of sides $L_{A11}$ and $L_{A12}$; a second pair of sides $L_{A21}$ and $L_{A22}$ and a third pair of sides $L_{A31}$ and $L_{A32}$. As used herein, a "pair of sides" refers to the two sides of the hexagon that are parallel to each other. For the memory array arrangement in FIG. 3A, each hexagon of the hexagonal lattice has a first pair of sides (e.g., $L_{A11}$ and $L_{A12}$) that are parallel to a first direction (x axis) and perpendicular to a second direction (y axis).

Figure 3B:
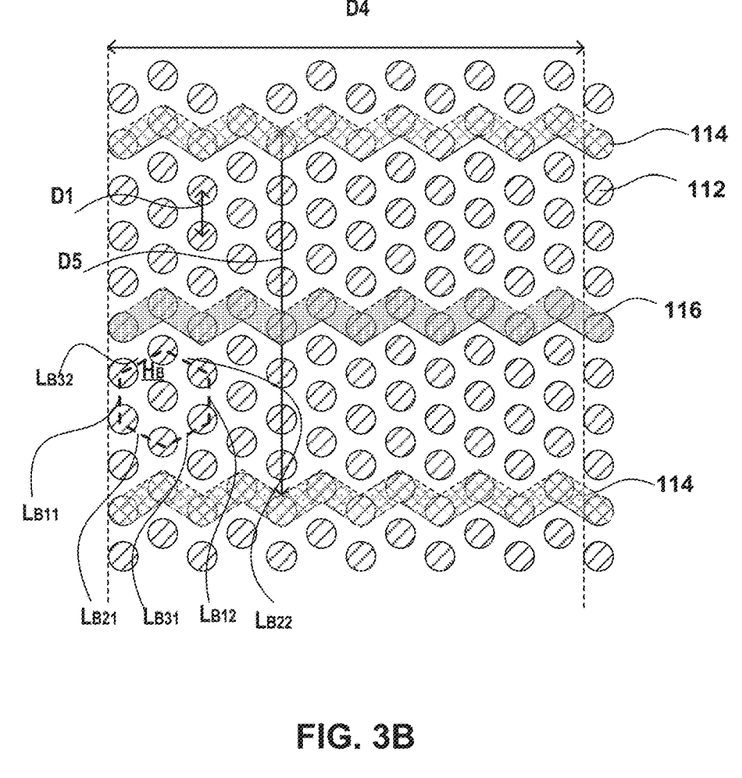
FIG. 3B illustrates a schematic enlarged plan view of a NAND string region of a 3D memory device with a memory array arrangement, according to some embodiments of the present disclosure.

FIG. 3B illustrates a schematic enlarged plan view of a NAND string region 110 of 3D memory device with a memory array arrangement, according to some embodiments. A plurality of NAND strings 112 can be arranged in a hexagonal lattice. Each NAND string can be disposed at vertices and center of hexagons of a hexagonal lattice. Each hexagon (e.g., hexagon HB) within the hexagonal lattice has a same hexagonal shape, which can be a regular hexagonal shape in which all sides of the hexagon have the same length. The angle between adjoining sides of each hexagon can be 60 degrees. Each hexagon has three pairs of sides, e.g., a first pair of sides $L_{B11}$ and $L_{B12}$; a second pair of sides $L_{B21}$ and $L_{B22}$ and a third pair of sides $L_{B31}$ and $L_{B32}$. Each hexagon of the hexagonal lattice has a first pair of sides (e.g., $L_{B11}$ and $L_{B12}$) that are perpendicular to a first direction (x axis) and parallel to a second direction (y axis). NAND string region 110 can include a plurality of slit structures 114. Each slit structure 114 can extend in the first direction (x axis) in a zigzag pattern, separating NAND string region 110 into multiple memory blocks and/or memory fingers. Slit structure 114 is parallel to the second and the third pairs of sides of each hexagon (e.g., the second pair of sides $L_{B21}$ and $L_{B22}$ and the third pair of sides $L_{B31}$ and $L_{B32}$) of the hexagonal lattice, forming a zigzag pattern extending in the first direction (x axis). In some embodiments, plurality of NAND strings 112 intersect with each conductor layer 206 forming a plurality of intersections, and the plurality of intersections form a hexagonal lattice in the horizontal plane (x-y plane). Slit structure 114 is parallel to the second and the third pair of sides of each hexagon of the hexagonal lattice (e.g., the second pair of sides $L_{B21}$ and $L_{B22}$ and the third pair of sides $L_{B31}$ and $L_{B32}$), forming a zigzag pattern extending in the first direction (x axis).

Compared with memory array arrangement in FIG. 3A, the memory array arrangement in FIG. 3B can increase the memory density of the memory device by at least about 6%. To illustrate the increase of memory density, a NAND string area including 72 NAND strings can be used as an example. Generally, the spacing (D1) between the centers of any two adjacent NAND string in the hexagonal lattice is equal. In some embodiments, D1 can be about 156 nm. As shown in FIG. 3A, the total length in the second direction (y axis) is D2=156×9=1404 nm, and the total length in the first direction (x axis) is D3=1528 nm, therefore the area occupied by the 72 NAND strings with the memory array arrangement as FIG. 3A is A1=1404×1528=1145312. As shown in FIG. 3B, the length in the first direction (x axis) is D4=6×sqrt (3)× 156=1621.2, and the length in the second direction (y axis) is D5=156×8=1248. The area occupied by the 72 NAND strings with the memory array arrangement as FIG. 3B is A2=1621.2×1248=2023257.6. (A1-A2)÷A2=(1145312-2023245.6)÷2011145.6=6%. It is thus calculated that the memory density is increased by 6% by rotating the hexagonal lattice memory array arrangement in FIG. 3A 30-degree clockwise on the x-y plane.

Figure 4A:
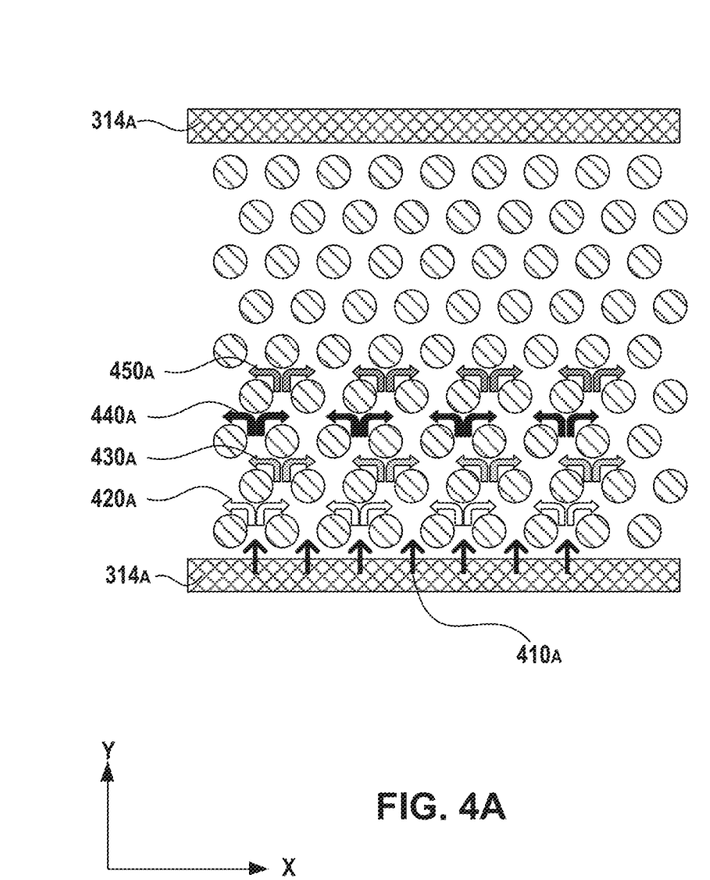
FIG. 4A illustrates a schematic gas pathway in a NAND string region of a 3D memory device with a memory array arrangement.
Figure 4B:
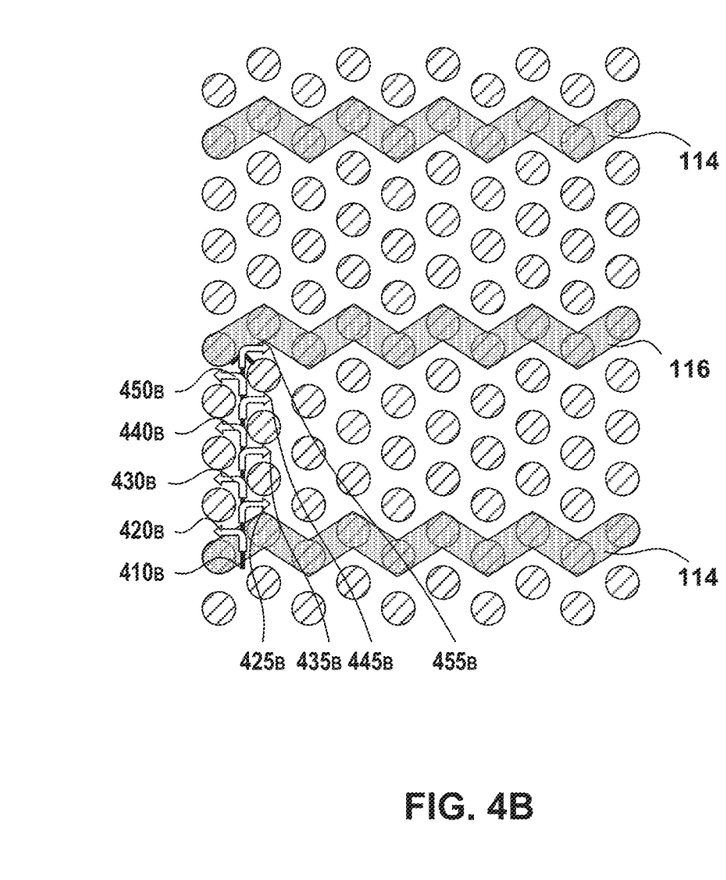
FIG. 4B illustrates a schematic gas pathway in a NAND string region of a 3D memory device with a memory array arrangement, according to some embodiments of the present disclosure.

FIG. 4A illustrates a schematic gas pathway in a NAND string region of 3D memory device with a memory array arrangement. FIG. 4B illustrates a schematic gas pathway in a NAND string region of 3D memory device with a memory array arrangement, according to some embodiments. During the fabrication process of a 3D memory device, the channel hole needs to be etched. In the etching process, a metal layer can be deposited on the NAND string. In some embodiments, slit structure $314_A$ and 114 can be a gate line slit. In some embodiments, the gate line slit can further include a plurality of through holes for depositing the metal layer onto the plurality of NAND strings during fabrication process. In some embodiments, the metal layer can include tungsten. Compared with the memory array arrangement in FIG. 4A, the memory array arrangement in FIG. 4B can provide smooth ventilation for uniform etching and deposition. As shown in FIG. 4A, after the gas (indicated by gas flow arrow $410_A$) passing through the gap of the first row of NAND strings, the gas pathway is blocked by the second row of NAND strings and gas flow is diverted into two different directions (e.g., as indicated by arrow $420_A$). Similarly, after passing through the gap of the second row of NAND strings, the gas pathway is again blocked by the third row of NAND strings and gas flow again splits into two different directions (e.g., as indicated by arrow 430). The series of arrows (e.g., arrows $420_A$, $430_A$, $440_A$ and $450_A$) indicate the blockage of gas flow and diverted gas paths due to the memory array arrangement. The blocked gas pathway can cause uneven etching and deposition. As shown in FIG. 4B, with NAND string arranged in a straight line in the second direction (y axis), the gas can pass along the second direction (y axis) smoothly in a straight direction (as indicated by gas flow arrow $410_B$) and diffuse towards the second direction (as indicated by arrow $420_B$, $425_B$, $430_B$, $435_B$, $440_B$, $445_B$, $450_B$, and $455_B$) without any hindrance, therefore, achieving uniform deposition of the metal layer.

Figure 5A:
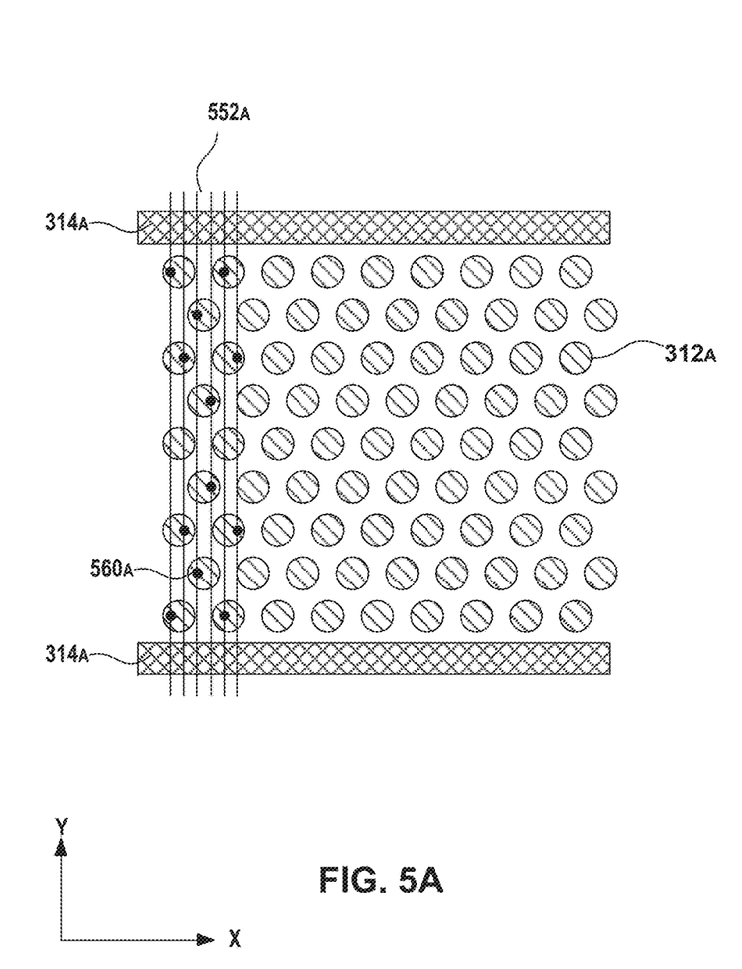
FIG. 5A illustrates a bit line contact structure of a 3D memory device.
Figure 5B:
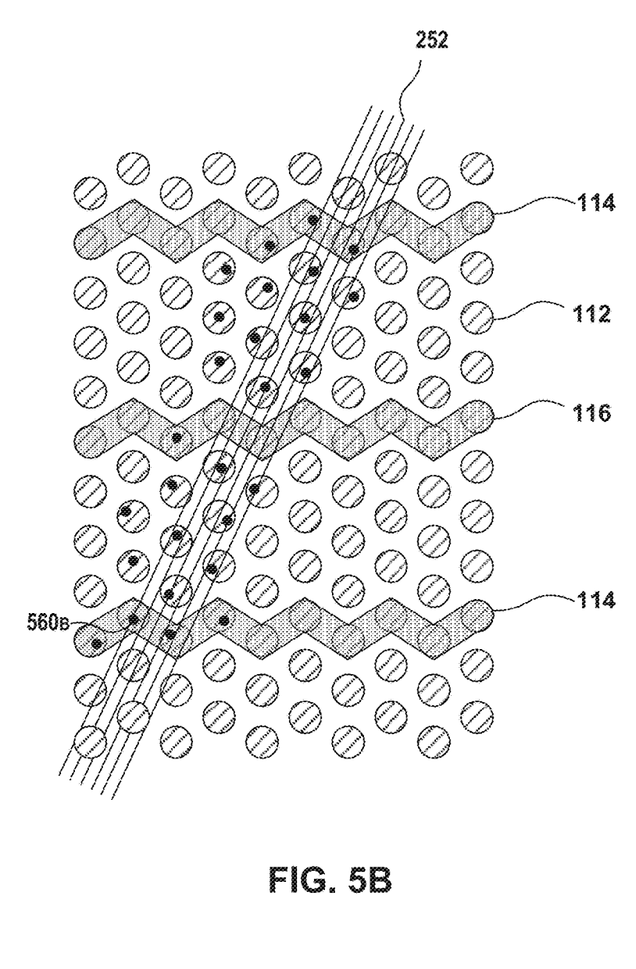
FIG. 5B illustrates a bit line contact structure of a 3D memory device, according to some embodiments of the present disclosure.

FIG. 5A illustrates a bit line contact structure of a 3D memory device. FIG. 5B illustrates a bit line contact structure of a 3D memory device, according to some embodiments of the present disclosure. As shown in FIG. 5A and FIG. 5B, the 3D memory device can include a plurality of bit lines (e.g., bit line $552_A$ or bit line 252) connected to NAND strings (NAND strings $312_A$ and 112) forming a plurality of conductive contacts ($560_A$ and $560_B$) in a top interconnected layer. The bit lines can be used to individually address a corresponding NAND string. In some embodiments, the bit line is perpendicular to the gate select lines. In some embodiments, top select gate 116 is parallel to slit structure 114 (e.g., gate select lines), forming a zigzag pattern extending in the first direction, as shown in FIG. 5B. Bit line 252 can form a 30-degree angle with respect to the second direction (y axis). Compared with memory array arrangement in FIG. 5A, memory array arrangement $110_B$ in FIG. 5B can enhance bit line contact efficiency as a result of the increase of number of conductive contact between the bit line and the NAND string per bit line.

Figure 6A:
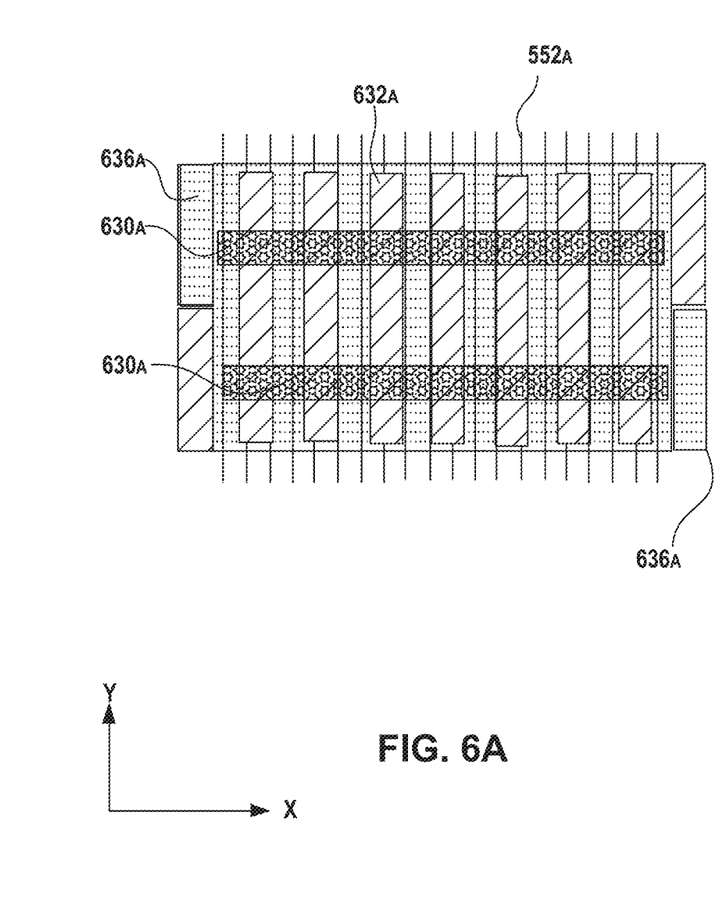
FIG. 6A illustrates a TAC region with a bit line pickup structure of a 3D memory device.
Figure 6B:
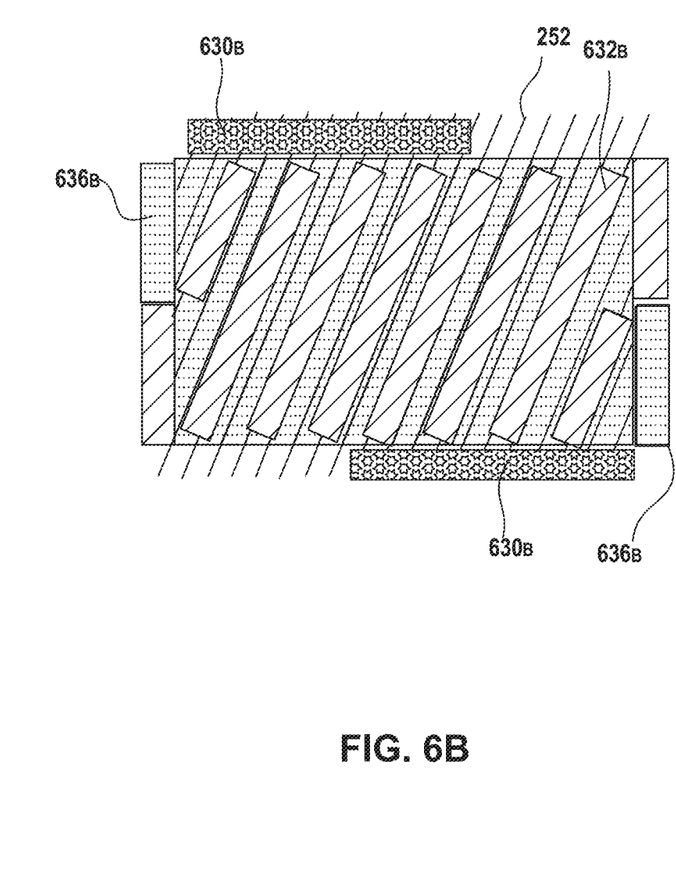
FIG. 6B illustrates a TAC region with a bit line pickup structure of a 3D memory device, according to some embodiments of the present disclosure.

FIG. 6A illustrates a TAC region with a bit line pickup structure of a 3D memory device. FIG. 6B illustrates a TAC region with a bit line pickup structure of a 3D memory device, according to some embodiments of the present disclosure. The TAC region can include TAC structures (e.g., TAC structure $632_A$ and structure $632_B$) between staircase regions (e.g., staircase regions $636_A$ and structure $636_B$). Both the power supply and the peripheral signal can be provided to the 3D memory device through the TAC structures. The TAC structures can connect with the bit lines (e.g., bit lines $552_A$ and bit lines 252). In some embodiments, bit line pickup region can include a bit line pickup area (e.g., bit line pickup area $630_A$ and bit line pickup area $630_B$). The bit line pickup area can be used for wiring and addressing of the bit lines (e.g., bit line $552_A$ and bit line 252). Compared with memory array arrangement in FIG. 6A, memory array arrangement in FIG. 6B can increase 3D memory device layout efficiency of the TAC structure with reduced bit line pickup area $630_B$ while maintaining same number of the bit lines.

Figure 7A:
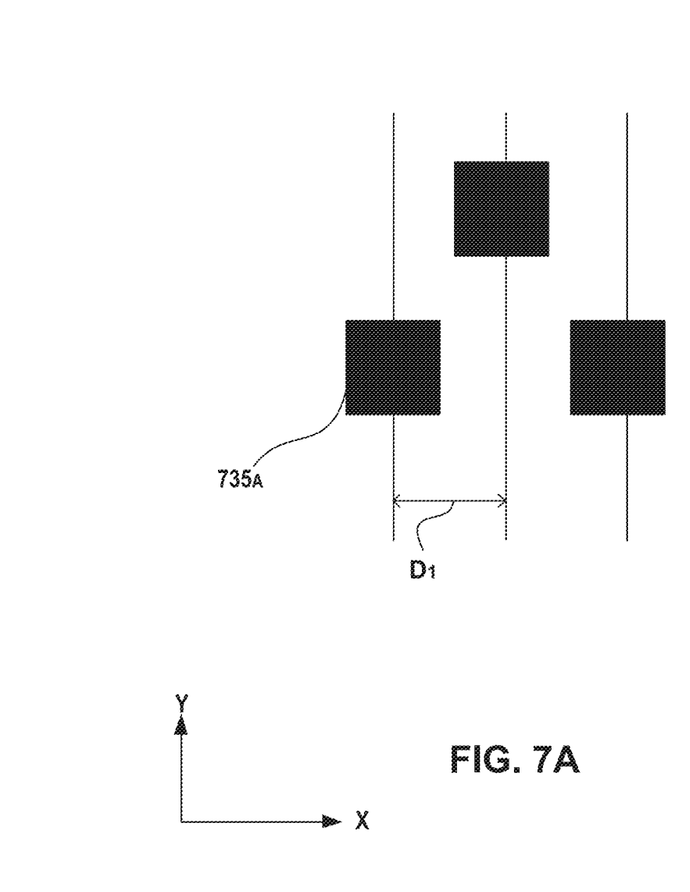
FIG. 7A illustrates a bit line contact structure of a 3D memory device.
Figure 7B:
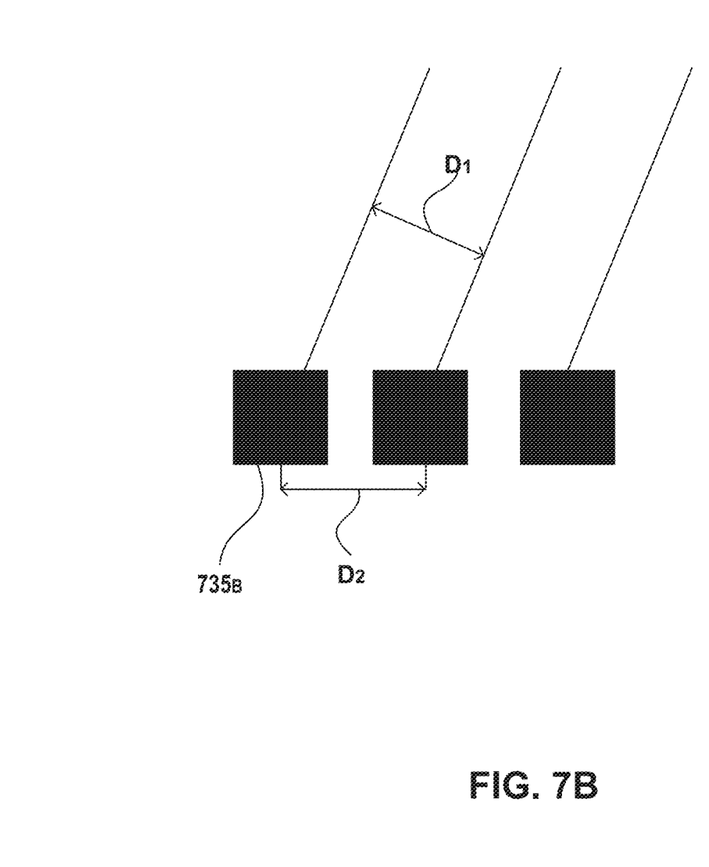
FIG. 7B illustrates a bit line contact structure of a 3D memory device, according to some embodiments of the present disclosure.

FIG. 7A illustrates a bit line contact structure of a 3D memory device. FIG. 7B illustrates a bit line contact structure of a 3D memory device, according to some embodiments of the present disclosure. Each bit line pickup area (bit line pickup area $630_A$ in FIG. 6A and bit line pickup area $630_B$ in FIG. 6B) can include a plurality of bit line contacts ($735_A$ and $735_B$). In some embodiments, a spacing between two neighboring bit lines ($D_1$) is between about 10 nm and about 60 nm. In some embodiments, the spacing between two neighboring bit lines is about 39 nm. As shown in FIG. 7B, a spacing between two neighboring bit line contacts ($D_2$) is D1/cos (30-degrees), which equals to D1/(sqrt (3)/2). In some embodiments, the spacing between two neighboring bit line contacts is about 1.15*D nm. In some embodiments, a spacing between two neighboring bit lines contacts is between about 11 nm and about 69 nm. In some embodiments, the spacing between two neighboring bit line contacts is about 45 nm. Compared with the memory array arrangement in FIG. 7A, the memory array arrangement in FIG. 7B can increase the spacing between two neighboring bit line contacts while maintaining the same spacing between bit lines, which reduces the process difficulty in 3D memory device fabrication process.

Figure 8:
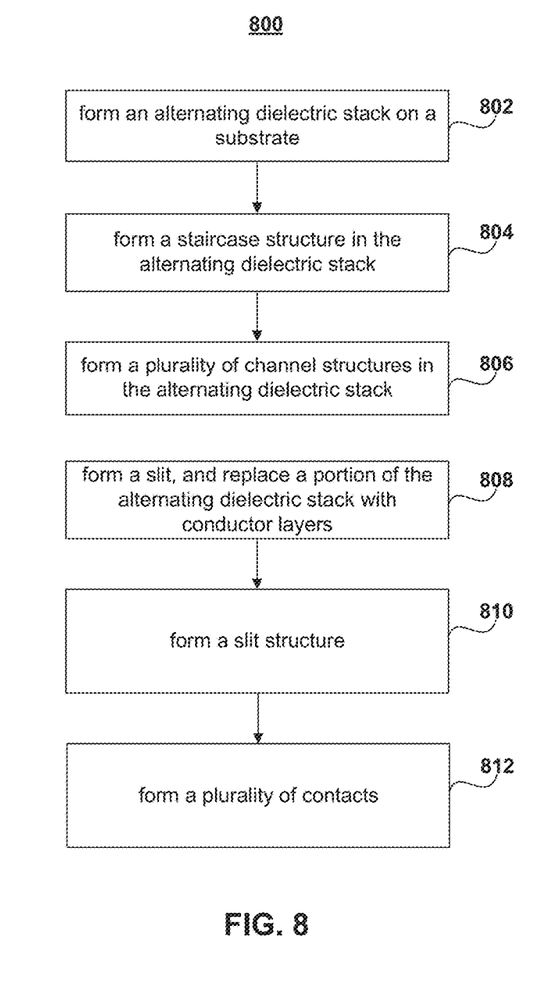
FIG. 8 is a flowchart of an exemplary method for forming a 3D memory device, according to some embodiments of the present disclosure.

FIG. 8 is a flowchart of an exemplary method 800 for forming a 3D memory device, according to some embodiments of the present disclosure. Operations shown in method 800 are not exhaustive; other steps can be performed as well before, after, or between any of the illustrated steps. In some embodiments, operations of method 800 can be performed in a different order. Variations of method 800 are within the scope of the present disclosure.

Referring to FIG. 8, method 800 starts at operation 802, in which an alternating dielectric stack is formed on a substrate (e.g., substrate 202 in FIG. 2). The substrate can be a silicon substrate. A plurality of first dielectric layers and second dielectric layers can be formed on the substrate to form the alternating dielectric stack. In some embodiments, each dielectric layer includes a layer of silicon nitride and a layer of silicon oxide. Alternating dielectric stack can be formed by one or more thin film deposition processes including, but not limited to, CVD, PVD, ALD, or a combination thereof.

Method 800 proceeds to operation 804, in which a staircase structure is formed in the alternating dielectric stack. In some embodiments, a trim-etch process can be performed on at least one side (in the lateral direction) of the alternating dielectric stack to form the staircase structure with multiple levels. Each level can include one or more dielectric layers with alternating dielectric stack.

Method 800 proceeds to operation 806, in which a channel structure is formed to form a NAND string. Each channel structure can extend vertically through the alternating dielectric stack. In some embodiments, fabrication processes to form the channel structure (e.g., channel structure 218 in FIG. 2) further include forming a channel hole that extends vertically through alternating dielectric stack by, for example, wet etching and/or dry etching. In some embodiments, fabrication processes to form channel structure 218 further include forming semiconductor channel 220 and memory film 222 between semiconductor channel 220 and the dielectric layers in alternating dielectric stack. Semiconductor channel 220 can include semiconductor materials, such as polysilicon. Memory film 222 can be a composite dielectric layer, such as a combination of a tunneling layer, a storage layer, and a blocking layer.

The tunneling layer can include dielectric materials including, but not limited to, silicon oxide, silicon nitride, silicon oxynitride, or a combination thereof. Electrons or holes from the semiconductor channel can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or a combination thereof. The blocking layer can include dielectric materials including, but not limited to, silicon oxide or a combination of silicon oxide/silicon nitride/silicon oxide (ONO). The blocking layer can further include a high-k dielectric layer, such as an aluminum oxide ($Al_2O_3$) layer. Semiconductor channel 220 and memory film 222 can be formed by one or more thin film deposition processes, such as ALD, CVD, PVD, any other suitable processes, or a combination thereof. In some embodiments, an etch stop layer can be formed on the channel structure.

In some embodiments, dummy channel structures (e.g., dummy channel structures 122 in FIG. 1) are formed simultaneously with channel structures 218. The dummy channel structures can extend vertically through the alternating layer stack and can be filled with the same materials as those in channel structures 218. Different from channel structures 218, contacts are not formed on the dummy channel structures to provide electrical connections with other components of the 3D memory device. Thus, the dummy channel structures cannot be used for forming memory cells in the 3D memory device.

In some embodiments, a barrier structure can be formed. The barrier structure can extend vertically through the alternating layer stack, such that the alternating layer stack is separated laterally into an alternating dielectric stack region including a plurality of dielectric layers, and an alternating conductor/dielectric stack region including a plurality of conductor/dielectric layers.

Method 800 proceeds to operation 808, in which a slit is formed, and first dielectric layers in the alternating dielectric stack (e.g., in the NAND string region) are replaced with conductor layers through the slit. For example, slit structure 114 can be first formed by wet etching and/or dry etching of dielectrics (e.g., silicon oxide and silicon nitride) through alternating dielectric stack. In some embodiments, the formed slits are used for the gate replacement process (also known as the "word line replacement" process) that replaces the second dielectric layers with conductor layers. After the gate replacement process, alternating dielectric stack becomes alternating layer stack including alternating conductor/dielectric stack (e.g., conductor/dielectric stack 216) in the NAND string region (e.g., NAND string region 110).

Method 800 proceeds to operation 810, in which slit structures are formed. Slit structures 114 can be formed by filling (e.g., depositing) conductor materials into the slits by PVD, CVD, ALD, any other suitable process, or a combination thereof. Slit structures 114 can include conductor materials including, but not limited to, W, Co, Cu, Al, polysilicon, silicides, or a combination thereof. In some embodiments, a dielectric layer (e.g., a silicon oxide layer) is formed first between the conductor materials of slit structure 114 and conductor layers 206 surrounding slit structure 114 in alternating conductor/dielectric stack 216 for insulation purposes. The lower end of slit structure 114 can be in contact with doped region 230. In some embodiments, slit structure 114 functions as a source contact electrically connected to NAND string 112 by doped region 230 of substrate 202. The upper end of each slit structure 114 is flush with the upper end of each etch stop plug 226 (e.g., on the top surface of the dielectric layer in which etch stop plugs 226 and slit structures 114 are formed. Slit structures 114 can be extended in parallel along a lateral direction to divide the memory array into multiple memory fingers. A top select gate can be formed in the middle of the memory finger to separate the memory finger into two equal parts. In some embodiments, the top select gate is parallel to the slit structure, forming a zigzag pattern extending in the first direction.

Method 800 proceeds to operation 812, in which a plurality of contacts are formed on the substrate. The contact (including NAND string contacts 238, gate slit contacts 240, TAC 126, and bit line contacts 248) can be formed through a dielectric layer by first etching vertical openings (e.g., by wet etching and/or dry etching), followed by filling the openings with conductor materials using ALD, CVD, PVD, any other suitable processes, or a combination thereof. The conductor materials used to fill the contacts can include, but are not limited to, W, Co, Cu, Al, polysilicon, silicides, or a combination thereof. The contacts can be simultaneously formed in the same contact forming process. A contact forming process can include multiple processes, for example, photolithography, etching, thin film deposition, and CMP.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A three-dimensional (3D) memory device, comprising:
   an alternating conductor/dielectric stack disposed on a substrate, wherein the alternating conductor/dielectric stack comprises a dielectric layer and a conductive layer stacked in a vertical direction;
   a plurality of channel holes formed on the substrate penetrating the alternating conductor/dielectric stack;
   a channel structure in each channel hole; and
   a plurality of gate line slits disposed on the substrate, wherein:
      the plurality of channel holes are perpendicular to the substrate and are arranged in a hexagonal lattice orientation comprising a plurality of hexagons;

each hexagon comprises three pairs of sides, wherein a first pair is perpendicular to a first direction and parallel to a second direction, and wherein the second direction is perpendicular to the first direction; and the plurality of gate line slits extend vertically through the dielectric layer and the conductive layer.

2. The 3D memory device of claim 1, wherein the three pairs of sides further include a second pair of sides, and a third pair of sides, and wherein the plurality of gate line slits are parallel to the second and the third pairs of sides of each hexagon of the hexagonal lattice.

3. The 3D memory device of claim 1, wherein the channel structure comprises a semiconductor channel and a memory film.

4. The 3D memory device of claim 1, further comprising: a top select gate structure, wherein the top select gate is parallel to a gate line slit, forming a zigzag pattern extending in the first direction.

5. The 3D memory device of claim 1, wherein the plurality of gate line slits form a zigzag pattern extending in the first direction.

6. The 3D memory device of claim 1, wherein the plurality of channel holes are disposed at vertices and centers of the hexagons.

7. The 3D memory device of claim 6, wherein channel holes disposed at the centers of the hexagons comprise a same distance to adjacent channel holes disposed at the vertices of the hexagons.

8. The 3D memory device of claim 1, further comprising: a bit line configured to electrically connect with the channel structure and forming an angle of about 30 degrees with respect to the second direction.

9. A three-dimensional (3D) memory device, comprising:
an alternating conductor/dielectric stack disposed on a substrate, wherein the alternating conductor/dielectric stack comprises a dielectric layer and a conductive layer stacked in a vertical direction;
a plurality of channel structures extending vertically through the alternating conductor/dielectric stack, wherein:
the plurality of channel structures are arranged in a hexagonal lattice;
the hexagonal lattice comprises a plurality of hexagons, each hexagon comprising three pairs of sides; and
a first pair of sides are parallel to a first direction and perpendicular to a second direction, and wherein the first direction is perpendicular to the second direction; and
a slit extending vertically through the dielectric layer and the conductive layer, wherein the slit is parallel to the first direction.

10. The 3D memory device of claim 9, further comprising:
a plurality of bit lines configured to electrically connect with the plurality of channel structures.

11. The 3D memory device of claim 10, wherein the plurality of bit lines are perpendicular to the slit and parallel to the second direction.

12. The 3D memory device of claim 11, further comprising:
a plurality of bit line contacts wherein a spacing between two neighboring bit line contacts along the first direction is twice that of a spacing between two neighboring bit lines.

13. The 3D memory device of claim 12, wherein the plurality of bit line contacts are arranged in the hexagonal lattice.

14. The 3D memory device of claim 9, wherein each channel structure of the plurality of channel structures comprises a semiconductor channel and a memory film.

15. The 3D memory device of claim 9, wherein the plurality of channel structures are disposed at vertices and centers of the plurality of hexagons.

16. The 3D memory device of claim 15, wherein channel structures disposed at the centers of the plurality of hexagons comprise a same distance to adjacent channel structures disposed at the vertices of the plurality of hexagons.

17. A three-dimensional (3D) memory device, comprising:
NAND strings vertically stacked on a substrate, wherein:
the NAND strings are arranged as a hexagonal lattice, wherein the NAND strings are disposed at vertices and centers of hexagons of the hexagonal lattice; and
the hexagons of the hexagonal lattice each comprise a first pair of sides, a second pair of sides, and a third pair of sides, wherein the first pair of sides are perpendicular to a first direction; and
gate line slits extending parallel to the first direction and configured to divide the 3D memory device into multiple memory fingers, wherein the gate line slits are parallel to the second and the third pairs of sides of each hexagon of the hexagonal lattice.

18. The 3D memory device of claim 17, wherein the NAND strings disposed at the centers of the hexagons comprise a same distance to the NAND strings disposed at the vertices of the hexagons.

19. The 3D memory device of claim 17, wherein each of the NAND strings extends vertically through an alternating conductor/dielectric stack disposed on the substrate.

20. The 3D memory device of claim 19, wherein each of the NAND strings comprises a semiconductor channel and a memory film.

* * * * *